US009006570B2

(12) United States Patent
Blakemore

(10) Patent No.: US 9,006,570 B2
(45) Date of Patent: Apr. 14, 2015

(54) SEALING BETWEEN AN ELECTRICAL CABLE AND A FLEXIBLE METAL CONDUIT TO BE USED IN A HIGH TEMPERATURE, HIGH VIBRATION ENVIRONMENT

(71) Applicant: General Electric Company, Schenectady, NY (US)

(72) Inventor: Joseph Cleary Blakemore, Stow, OH (US)

(73) Assignee: General Electric Company, Schenectady, NY (US)

( * ) Notice: Subject to any disclaimer, the term of this patent is extended or adjusted under 35 U.S.C. 154(b) by 303 days.

(21) Appl. No.: 13/671,681

(22) Filed: Nov. 8, 2012

(65) Prior Publication Data

US 2014/0124235 A1     May 8, 2014

(51) Int. Cl.
 *H05K 13/00*   (2006.01)
 *H05K 5/00*    (2006.01)
 *H02G 15/04*   (2006.01)
 *F01D 1/00*    (2006.01)

(52) U.S. Cl.
 CPC ........... *H05K 13/00* (2013.01); *Y10T 29/49117* (2015.01); *H05K 5/00* (2013.01); *H02G 15/046* (2013.01); *F01D 1/00* (2013.01)

(58) Field of Classification Search
 CPC .................. H05K 13/00; H05K 5/00
 USPC ..................... 174/50.5, 658; 29/825
 See application file for complete search history.

(56) References Cited

U.S. PATENT DOCUMENTS

| | | | | |
|---|---|---|---|---|
| 3,205,727 A | * | 9/1965 | Sevrence | 74/500.5 |
| 4,835,342 A | * | 5/1989 | Guginsky | 174/653 |
| 5,321,205 A | | 6/1994 | Bawa | |
| 7,824,214 B2 | * | 11/2010 | Paynter | 439/578 |

FOREIGN PATENT DOCUMENTS

| | | | | |
|---|---|---|---|---|
| GB | 1119926 A | * | 7/1968 | |
| GB | 1231619 A | * | 5/1971 | |
| GB | 1501860 A | * | 2/1978 | |

\* cited by examiner

*Primary Examiner* — Timothy Thompson
*Assistant Examiner* — Charles Pizzuto
(74) *Attorney, Agent, or Firm* — Cooper Legal Group, LLC

(57) ABSTRACT

A flame sensor apparatus and a cable assembly apparatus are provided for use in sensing characteristics of a flame within a combustion chamber. The flame sensor apparatus includes an electrical assembly remote from a sensor assembly. A cable assembly extends between the sensor assembly and the electrical assembly. The cable assembly includes two cable ends and a housing that defines an internal volume. Cable fittings are connected to the cable ends through a first seal. A second seal is located in the annular space between the electrical cable and the cable fitting opening at the first cable end. The cable assembly includes a third seal and at least one deformable sealing component located at the second cable end. The seals are configured to prevent moisture, gas, and contaminants from passing through the cable fitting opening. Additionally, a method of sealing an electrical cable and a flexible conduit is provided.

18 Claims, 7 Drawing Sheets

SEALING BETWEEN AN ELECTRICAL CABLE AND A FLEXIBLE METAL CONDUIT TO BE USED IN A HIGH TEMPERATURE, HIGH VIBRATION ENVIRONMENT

BACKGROUND OF THE INVENTION

1. Field of the Invention

The invention relates to a flame sensor, and specifically relates to a sealed cable assembly for a flame sensor which senses characteristics of a flame in a combustion chamber.

2. Discussion of Prior Art

Within an oil or gas fueled turbine, fuel is fed into a combustion chamber within which an ignition flame is present. If the flame becomes extinguished, commonly referred to as a flame-out condition, it is undesirable for fuel to continue to be fed into the hot combustion chamber without appropriate ignition. Consequently, if the ignition flame is extinguished within the combustion chamber, the fuel feed into the combustion chamber should be quickly terminated and thus limit un-combusted fuel build up.

A flame sensor is generally used for detecting the presence or absence of an ignition flame within a combustion chamber of a gas turbine. Also, flame sensing electronics are commonly associated with the flame sensor within the turbine arrangement. The flame sensing electronics may be temperature sensitive and can be located a distance from the relatively hot temperatures in and near the combustion chamber. A low magnitude current signal from a sensor near the combustion chamber can be transferred to the flame sensing electronics. The signal can be transferred via an electrical cable that is part of a sealed cable assembly environment which helps preserve the low magnitude current signal. Accordingly, it would be useful to provide a flexible and durable cable assembly that withstands high temperature and vibration and includes a self-contained sealed environment to help limit low magnitude current signal degradation while providing ease of assembly and limit the assembly steps required in a controlled atmosphere.

BRIEF DESCRIPTION OF THE INVENTION

The following summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

One aspect of the invention provides a cable assembly that includes a housing. The housing defines an internal volume and the housing includes a first cable end portion and a second cable end portion. The cable assembly also includes at least two cable fittings, wherein the first cable end portion and the second cable end portion are connected to a cable fitting through a first seal. Each of the cable fittings define a cable fitting opening. The cable assembly further includes an electrical cable. The electrical cable is inserted through the cable fitting opening in each cable fitting and through the internal volume of the housing. The cable assembly still further includes a second seal located in the annular space between the electrical cable and the cable fitting opening at the first cable end portion. The second seal is configured to prevent moisture and contaminants from passing through the cable fitting opening. The cable assembly also includes a third seal and at least one deformable sealing component located at the second cable end portion. The third seal and the at least one deformable sealing component are configured to prevent moisture and contaminants from passing through the cable fitting opening.

Another aspect of the invention provides a flame sensor apparatus including a sensor assembly for sensing characteristics of a flame within a combustion chamber. The flame sensor apparatus also includes an electrical assembly that is remote from the sensor assembly. The flame sensor apparatus further includes a cable assembly extending between the sensor assembly and the electrical assembly. The cable assembly includes a housing. The housing defines an internal volume and the housing includes a first cable end portion and a second cable end portion. The cable assembly also includes at least two cable fittings, wherein the first cable end portion and the second cable end portion are connected to a cable fitting through a first seal. Each of the cable fittings defines a cable fitting opening. The cable assembly further includes an electrical cable. The electrical cable is inserted through the cable fitting opening in each cable fitting and through the internal volume of the housing. The cable assembly still further includes a second seal located in the annular space between the electrical cable and the cable fitting opening located at the first cable end portion. The second seal is configured to prevent moisture and contaminants from passing through the cable fitting opening. The cable assembly also includes a third seal and at least one deformable sealing component located at the second cable end portion. The third seal and the at least one deformable sealing component are configured to prevent moisture and contaminants from passing through the cable fitting opening.

Another aspect of the invention provides a method of sealing an electrical cable and a flexible conduit including the step of providing a housing. The housing defines an internal volume and the housing includes a first cable end portion and a second cable end portion. The method also includes the step of connecting a cable fitting to each of the first cable end portion and the second cable end portion using a first seal. Each of the cable fittings defines a cable fitting opening. The method further includes the step of providing an electrical cable, wherein the electrical cable is inserted through the cable fitting opening in each cable fitting and through the internal volume of the housing. The method still further includes the step of sealing the annular space between the electrical cable and a cable fitting opening with a second seal at the first cable end portion. The second seal preventing moisture and contaminants from passing through the cable fitting opening. The method also includes the step of sealing the annular space between the electrical cable and a cable fitting with a third seal and at least one deformable sealing component at the second cable end portion.

BRIEF DESCRIPTION OF THE DRAWINGS

The foregoing and other aspects of the invention will become apparent to those skilled in the art to which the invention relates upon reading the following description with reference to the accompanying drawings, in which.

DETAILED DESCRIPTION OF THE INVENTION

Figure 1:
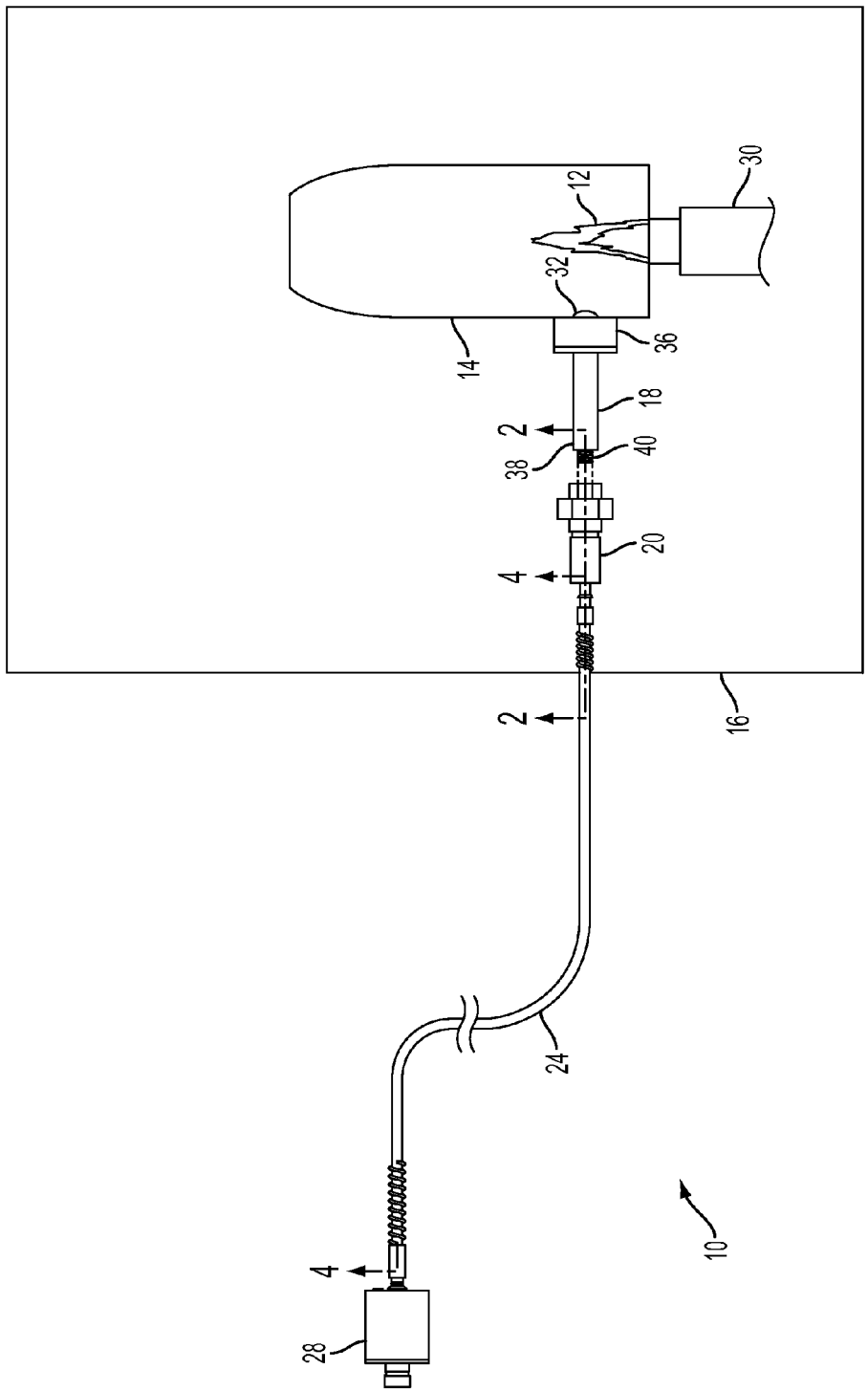
FIG. 1 is a partially exploded, schematized cross-section view of an example flame sensor apparatus in accordance with at least one aspect of the present invention.

Example embodiments that incorporate one or more aspects of the invention are described and illustrated in the drawings. These illustrated examples are not intended to be a limitation on the invention. For example, one or more aspects of the invention can be utilized in other embodiments and even other types of devices. Moreover, certain terminology is used herein for convenience only and is not to be taken as a limitation on the invention. Still further, in the drawings, the same reference numerals are employed for designating the same elements.

FIG. 1 schematically illustrates an example flame sensor apparatus 10 for monitoring specific characteristics of a flame 12. The flame 12 is located within a combustion chamber 14 of a turbine 16 and emits electromagnetic radiation energy. A sight tube 18 can be attached to the combustion chamber 14. A sensor assembly 20 is operably connected with the combustion chamber 14 and can receive the electromagnetic radiation energy from the flame 12 through the sight tube 18. The sensor assembly 20 includes a photodiode, which generates a current, such as a photocurrent, based on the electromagnetic radiation energy. This current can then pass from the sensor assembly 20, through a cable assembly 24, and to an electrical assembly 28, whereupon the electrical assembly 28 can determine the flame's characteristics, such as the presence or absence of the flame or combustion efficiency based on the spectrum the flame 12 emits. In accordance with an aspect of the present invention, the electrical assembly 28 can be remote from the photodiode within the sensor assembly 20. As such, the electrical assembly 28 monitors the flame's characteristics while being located in a relatively cooler environment away from the combustion chamber 14 and turbine 16 and heat associated with the flame of combustion.

Turning to the specific example shown in FIG. 1, the turbine 16 can include rotating turbine blades (not shown) powered by fuel combustion within the combustion chamber 14. The turbine 16 is generically/schematically shown in FIG. 1 to convey the concept that the turbine 16 can include a number of different structures and/or could be used in varied, different applications. For example, the turbine 16 could be constructed/configured for oil and gas combustion turbines and used in applications such as for aircraft propulsion, marine propulsion, land-based power generation, off shore power generation, or the like. In one particular example, the turbine 16 and flame sensor apparatus 10 can be used in power generation applications. As such, it is to be appreciated that the turbine 16 in FIG. 1 is not intended to be limiting on further examples.

The combustion chamber 14 can be positioned within the turbine 16. The combustion chamber 14 can define a substantially hollow internal area. It is to be understood that the combustion chamber 14 is generically/schematically represented in FIG. 1, and is not intended to be limiting on further examples. For instance, the generic representation of the combustion chamber 14 is intended to convey the concept that the combustion chamber 14 can represent a number of different constructions, some of which may be generally known. Similarly, the combustion chamber 14 described herein and as in association with the turbine 16 discussed above may be incorporated into a number of different applications.

A fuel nozzle 30 can be provided that delivers fuel (e.g., air, fuel, combustible materials, etc.) into the combustion chamber 14. The fuel nozzle 30 can cooperate with an opening, orifice, or the like in the combustion chamber 14 such that the fuel nozzle 30 can deliver the fuel from an exterior location into the combustion chamber 14. As such, the fuel nozzle 30 can deliver the fuel into the combustion chamber, whereupon the fuel can be ignited to propagate the flame 12. Ignited fuel within the combustion chamber 14 produces a relatively high-pressure gas. Again, the fuel nozzle 30 is generically/schematically represented in the shown example, and may include any number of fuel nozzle constructions that may be known. Further, the fuel nozzle 30 could be positioned at a number of locations within the combustion chamber 14, and is not limited to the location shown in FIG. 1.

An opening 32 can be provided in an outer wall of the combustion chamber 14. The opening 32 (shown generically in FIG. 1, as opening 32 is not normally visible in such a view), can extend completely through the outer wall. As such, an interior of the combustion chamber 14 can be optically exposed to a location that is exterior from the combustion chamber 14. The opening 32 can be positioned in near proximity to the flame 12, such that the opening 32 defines an optical path through the opening 32 and towards the flame 12. As such, electromagnetic radiation energy from the flame 12 propagates through the opening 32. The temperature adjacent the opening 32 can, in one example, be about 454° C., though a wide range of temperatures are contemplated. It is to be understood that the opening 32 is not limited to the location shown in FIG. 1, and could be positioned at a number of different locations on the combustion chamber 14.

The sight tube 18 is located in the optical path from the flame 12 and through the opening 32. As such, electromagnetic radiation energy from the flame 12 propagates through the sight tube 18 and the opening 32. FIG. 1 depicts the sight tube 18 for illustrative purposes to show the structural relationship between the sight tube 18 and the opening 32. It is to be understood, however, that in operation, the sight tube 18 and combustion chamber 14 are in a fully assembled state with the sight tube 18 attached to the combustion chamber 14. The sight tube 18 can be attached to the combustion chamber 14 in any number of ways, such as by mechanical fasteners, welding, adhesives, or the like. A suitable optically transparent window can be provided. The window can be made from a material that can withstand operating pressure and temperature of the combustion chamber 14, such as quartz.

Figure 2:
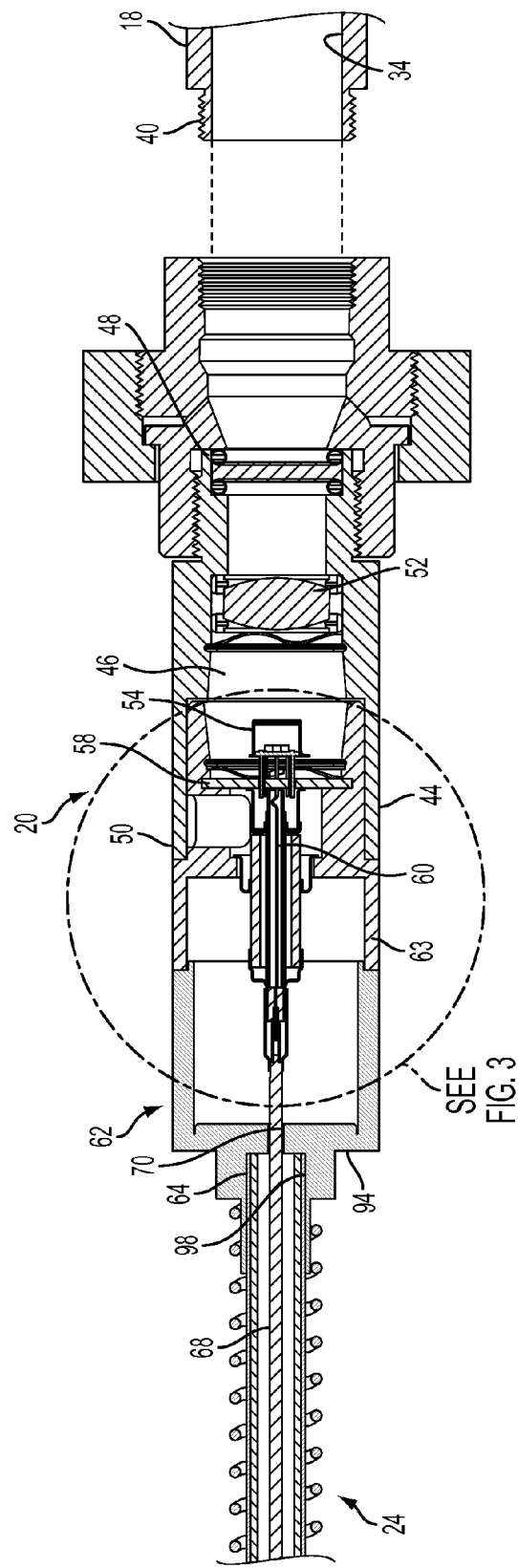
FIG. 2 is a partially exploded sectional view of an example cable assembly and an example sensor assembly along lines 2-2 of FIG. 1.

In one example, the sight tube 18 can be an elongated, substantially hollow cylindrical structure that defines an internal bore 34 (best seen in FIG. 2). The sight tube 18 is attached to the opening 32, such that an interior of the combustion chamber 14 is optically exposed to the internal bore 34 of the sight tube 18. In operation, the internal bore 34 of the sight tube 18 can be aligned with the opening 32, such that the sight tube 18 defines an optical path through the internal bore 34, through the opening 32, and into the interior area of the combustion chamber 14. As such, electromagnetic radiation energy from the flame 12 propagates through the internal bore 34 of the sight tube 18.

The sight tube 18 can include a proximal end 36 and a distal end 38. The proximal end 36 is located near the opening 32, and the distal end 38 is located opposite the proximal end 36. An attachment structure, such as a threaded portion or a screw thread 40, can be positioned at the distal end 38 of the sight tube 18. It is to be understood that the sight tube 18 could include any number of attachment structures, and is not limited to the screw thread 40 shown in FIG. 1. In one example, the screw thread 40 can be formed at an outer surface of the distal end 38 of the sight tube 18, so as to form an external male thread. The sensor assembly 20 can be threadingly engaged with the screw thread 40 on the sight tube 18 through the use of a generally known pipe union assembly, a union nut, or the like, though a wide range of fastening methods are contemplated.

Turning now to FIG. 2, the structure of an example sensor assembly 20 will be described. What follows is a simplified description for the purpose of clarity, and it is to be appreciated that a sensor assembly 20 can include additional components than those described here. The sensor assembly 20 can include a sensor body 44 that defines an internal sensor chamber 46 that is substantially hollow and extends axially along the length of the sensor body 44 between the first end portion 48 and the second end portion 50. The sensor body 44 extends along a longitudinal axis that is substantially coaxial with a longitudinal axis of the sight tube 18. As such, the internal sensor chamber 46 of the sensor body 44 is substantially coaxial with the internal bore 34 of the sight tube 18 and the opening 32 (best seen in FIG. 1). Accordingly, an optical path can extend through the sensor body 44, through the sight tube 18, and towards the flame 12. As such, the electromagnetic radiation energy can propagate from the flame 12, through the opening 32 and sight tube 18, and into the sensor body 44 of the sensor assembly 20.

Returning to FIG. 2, the sensor assembly 20 can include a lens 52. The lens 52 can be oriented substantially perpendicularly with respect to the longitudinal axis of the sensor body 44, such that the lens 52 extends radially across the internal sensor chamber 46. The lens 52 can include a number of different types of lenses, such as a biconvex lens, planoconvex lens, or the like. Furthermore, the lens 52 can include a fused silica lens. The lens 52 can be formed of a number of different materials, however, that can withstand the relatively high temperature, pressure, and vibratory environment that the sensor assembly 20 can encounter. As will be discussed in more detail below, the lens 52 can focus the electromagnetic radiation energy from the flame 12 towards the second end portion 50.

The sensor assembly 20 can further include a photodiode 54 positioned downstream (i.e., away from the combustion chamber 14 and the sight tube 18) from the lens 52. The photodiode 54 can include a solid state ultraviolet (UV) sensor that receives the focused electromagnetic radiation energy from the flame 12 through the lens 52. It is understood that a variety of photodiodes can be used in the sensor assembly 20.

As the photodiode 54 receives the electromagnetic radiation energy from the flame 12, it generates a current-based output signal, such as a photocurrent, based on the electromagnetic radiation energy. As is generally known, the electromagnetic radiation energy includes UV radiation. The photodiode 54 can generate a photocurrent that is proportional to the intensity level of the UV radiation received. The photocurrent can be relatively low magnitude, such as in a range of about $10^{-10}$ amperes. In one example, the current-based output signal can be delivered from the photodiode and be conditioned and supplied to a control system. In response, the signal can be used to activate a shut-off (not shown) to stop the flow of fuel to the combustion chamber 14.

The photodiode 54 is mounted to a circuit board 58. As is generally known, the circuit board 58 is electrically connected to the photodiode 54. The sensor assembly 20 can further include a center wire 60. The center wire 60 can be attached (e.g., electrically connected) to the circuit board 58, where the center wire 60 can receive the photocurrent from the photodiode 54. The center wire 60 can pass from the circuit board 58 to the second end portion 50 of the sensor body 44.

Moving downstream, the sensor assembly 20 can further include a seal adapter 63. The seal adapter 63 can be attached to the sensor body 44 by welding, brazing, or the like. The seal adapter 63 includes a generally cylindrical shape that matches (e.g., has a similar diameter) the shape of the sensor body 44. As such, the seal adapter 63 can be attached to the sensor body 44 by extending across an opening at the second end portion 50 of the sensor body 44. In another example, additional fittings or structure can be located downstream of the second end portion 50 of the sensor body 44 and the seal adapter 63. For example, a wire housing 62 can be located adjacent to the sensor body 44 and the seal adapter 63. In cases where the wire housing 62 is located downstream of the sensor body 44 and the seal adapter 63, the wire housing 62 can include a generally cylindrical shape that matches (e.g., has a similar diameter) the shape of the sensor body 44 and the seal adapter 63. In this manner, the seal adapter 63 can be configured to also match a mating structure on the cable assembly 24 which will be further described below.

Downstream from the sensor assembly 20, the flame sensor apparatus 10 further includes a cable assembly 24. A first cable end portion 64 is attached to the sensor assembly 20. The cable assembly 24 is in electrical communication with the photodiode 54 through the center wire 60 and a seal shield tube 416 (best seen in FIG. 3). As such, the cable assembly 24 can convey the photocurrent that is indicative of the flame's 12 characteristics from the photodiode 54 to a location that is remote from the photodiode 54. This location can, for example, be in a relatively cooler environment than the environment near the combustion chamber 14. In one example, the cable assembly 24 can be relatively long, such as in a range of 9.1 to 10.7 meters (e.g. 30 to 35 feet). As such, the location can be cooler than the area near the sensor assembly 20.

The cable assembly 24 further includes an electrical cable, such as a coaxial cable 68, extending between opposing ends of the cable assembly 24. The coaxial cable 24 has a center wire 60 and may include a shield braid. The coaxial cable 68 passes through a cable fitting opening 70 and is attached (e.g., electrically connected) to the center wire 60. As such, the coaxial cable 68 can receive the photocurrent from the photodiode 54 through the center wire 60, and the shield braid in present. It is to be appreciated that both the coaxial cable 68 and the respective attachment to the center wire 60 are somewhat generically/schematically depicted for illustrative purposes. Indeed, the coaxial cable 68 may be electrically connected to the center wire 60, and the shield braid if present, and the seal shield tube 416 (best seen in FIG. 4) in any number of ways, including soldering, or the like.

The coaxial cable 68 functions to convey the photocurrent indicative of the characteristics of the flame 12 from the photodiode 54. The photocurrent may be susceptible to degradation while being conveyed along the cable assembly 24. This is due, at least in part, to the photocurrent being relatively small, such as in the range of about $10^{-10}$ amperes. To accommodate for this factor, the coaxial cable 68 may include a low noise cable, that is to say it can be intentionally and purposefully constructed so as to be insensitive to external electromagnetic radiation.

Figure 3:
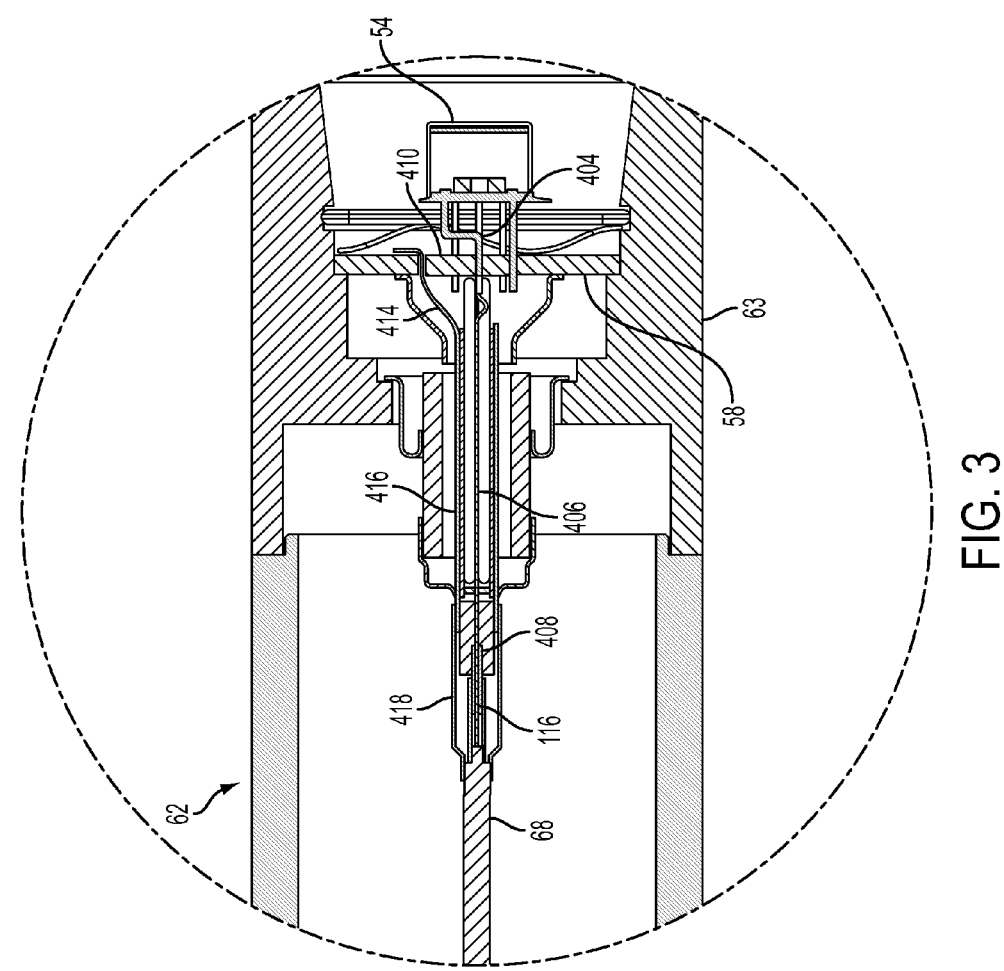
FIG. 3 is a detail view of an example conduction path from the example cable assembly of FIG. 2.

FIG. 3 illustrates one example of a multiple-conduction path of the current-based output signal from the photodiode 54 to the coaxial cable 68. The photodiode 54 receives ultraviolet (UV) radiation from the combustion chamber 14 (best seen in FIG. 1) in a gas turbine generator and converts the UV radiation energy into a current-based output signal. The signal is conducted through a first conduction path termed a signal current path and a second conduction path termed a shield current path to the cable assembly 24 (best seen in FIG. 4).

The signal current path operates as follows. The photodiode 54 generates an electrical signal (e.g., a signal current) and conducts the electrical signal along a signal lead 404 which passes through the circuit board 58. The signal lead 404 is in electrical communication with (e.g., connected to) a seal signal wire 406 which conducts the electrical signal to a seal signal tube 408. In turn, the seal signal tube 408 is in electrical communication with an inner conductor 116 within the coaxial cable 68. The electrical signal is conducted to the inner conductor 116 and through the cable assembly 24 (best seen in FIG. 4).

The shield current path operates as follows. The photodiode 54 generates an electrical signal (e.g., a signal current) and conducts the electrical signal to a shield pad 410 located on the circuit board 58. A shield wire 414 is connected to the shield pad 410 (e.g., soldered) and conducts the electrical signal to the seal shield tube 416. The seal shield tube 416 conducts the electrical signal to a nickel foil 418 soldered around the seal shield tube 416. The nickel foil 418 (FIG. 3) then conducts the electrical signal to a conductive layer 122 (see FIG. 5) within the coaxial cable 68.

Maintaining the signal current path and the shield current path enables both the inner conductor 116 and the conductive layer 122 to both carry the electrical signal. This partially or completely shields the electrical signal from electromagnetic interference. As such, the described arrangement and signal paths protect the electrical signal from coupling any electrical signal or interference that may be present on the sensor body 44 or the wire housing 62. Furthermore, the cable assembly 24 acts as a conductor and in conjunction with the coaxial cable 68 constitutes a triaxial construction between the first cable end portion 64 and the second cable end portion 78, enabling delivery of a relatively low magnitude electrical signal current across a relatively long cable assembly 24 to the electrical assembly 28.

The coaxial cable 68 can include a number of different constructions. In the shown example (see FIG. 5), the coaxial cable 68 includes the inner conductor 116, such as a copper wire. An insulating layer 118, such as polytetrafluoroethylene (PTFE), surrounds the inner conductor 116. The conductive layer 122 may be a carbon based conductive layer and is provided around the insulating layer 118. The conductive layer 122 may help to increase shielding, reduce static charge, and reduce electrical noise as the cable assembly 24 is moved. An outer braid, such as tinned copper, may be provided to surround the conductive layer 122. It is to be appreciated that the construction of the coaxial cable 68 described herein comprises only one possible example construction, as any number of configurations are envisioned. Indeed, some or all of the aforementioned layers could be modified.

Figure 4:
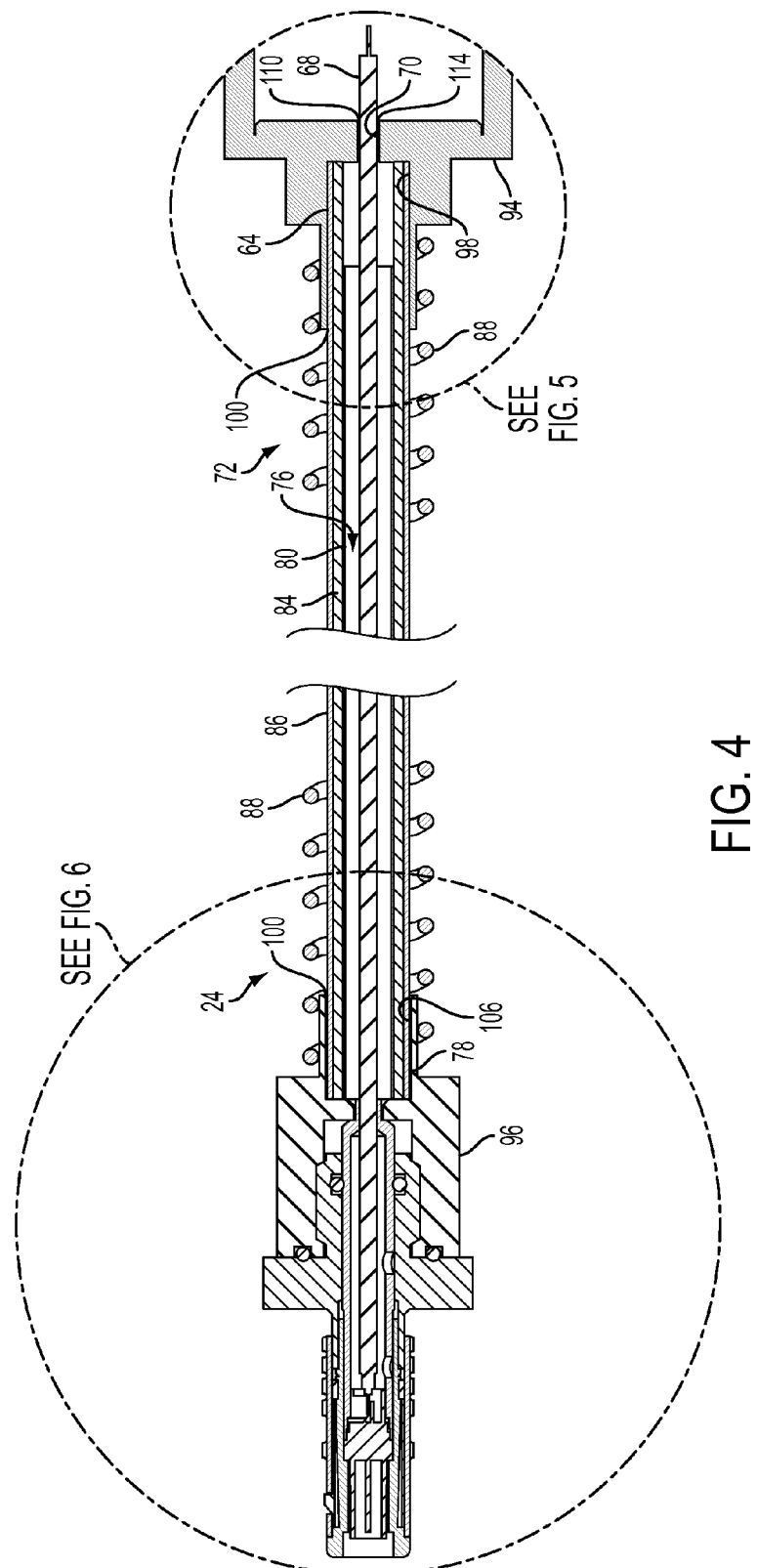
FIG. 4 is a sectional view of the example cable assembly along lines 4-4 of FIG. 1.

Referring now to FIG. 4, the structure of the example cable assembly 24 will be further described. It is to be appreciated that the cable assembly 24 is somewhat generically/schematically shown for illustrative purposes. Indeed, in operation, the cable assembly 24 is generally longer in length than as shown. However, to more clearly describe features of the cable assembly 24, only end portions are shown.

The cable assembly 24 includes a housing 72 that can be generally cylindrical in shape and defines an internal volume 76 while surrounding the coaxial cable 68. The housing 72 extends substantially coaxially with coaxial cable 68 between the first cable end portion 64 and a second cable end portion 78. The conduit acts as a conductor and in conjunction with the coaxial cable 68 constitutes a triaxial construction between the first cable end portion 64 and the second cable end portion 78. The housing 72 can be sufficiently flexible, such that the cable assembly 24 can be moved, bent, twisted, etc., yet still protect the coaxial cable 68 from possible pinching, shearing, severe bending, etc. that the coaxial cable 68 can encounter during typical operation. The housing 72 can include several layers that will now be described proceeding from the interior to the exterior of the housing 72.

The housing 72 includes a sock layer 80 surrounding the internal volume 76, such that the sock layer 80 is spaced a distance away from the coaxial cable 68. While only one sock layer is shown, it is to be appreciated that the sock layer 80 can include a plurality of sock layers. The sock layer 80 circumferentially surrounds the internal volume 76 and provides protection to the coaxial cable 68. The sock layer 80 extends substantially coaxially with the coaxial cable 68 between the first cable end portion 64 and the second cable end portion 78. The sock layer 80 can include a number of different materials and constructions, such as fiberglass materials, or the like. In one example, the sock layer 80 can be a ribbon of fiberglass material that is wound in a spiral within the internal volume 76. The sock layer 80 helps protect the coaxial cable 68 from wear caused by mechanical vibrations leading to moving contact between the coaxial cable 68 and other layers of the housing 72.

The housing 72 further includes a conduit layer 84 that circumferentially surrounds the sock layer 80. In one example, the conduit layer 84 can form a hermetic seal around the sock layer 80. The conduit layer 84 extends substantially coaxially with the sock layer 80 and coaxial cable 68 between the first cable end portion 64 and the second cable end portion 78. The conduit layer 84 can be sufficiently flexible, such that the cable assembly 24 can be moved, bent, twisted, etc. without experiencing permanent deformation. The conduit layer 84 can be formed of a metal or metal-like material, such as stainless steel. In addition to being somewhat flexible, the conduit layer 84 can provide a protective layer to the cable assembly 24, thus protecting the sock layer 80 and coaxial cable 68 from damage. Additionally, the conduit layer 84 can act as a protective layer for the cable assembly 24 by limiting and/or preventing the leakage of fluids, including gas, etc., both into and out of the cable assembly 24. Similarly, the conduit layer 84 can be water resistant and can limit or prevent the passage of liquids, moisture, condensation, or the like through the conduit layer 84. As such, the conduit layer 84 can withstand periodic liquid washes that are performed on the turbine 16 with little to no fluid transport through the conduit layer 84.

The housing 72 further includes an armored braid layer 86 that surrounds the conduit layer 84. The armored braid layer 86 has a slightly larger diameter than a diameter of the conduit layer 84, such that the armored braid layer 86 circumferentially extends around the conduit layer 84. The armored braid layer 86 extends substantially coaxially with the conduit layer 84 between the first cable end portion 64 and the second cable end portion 78. The armored braid layer 86 can be formed of a number of metal or metal-like materials that allow for flexibility, such as stainless steel. The armored braid layer 86 also provides protection to the conduit layer 84 from cuts, scratches, crushing, and the like.

The armored braid layer 86 can include any number of different materials, including stainless steel. It is to be understood that the armored braid layer 86 is designed to withstand a variety of environments, including relatively high temperature and pressure environments, such that the armored braid layer 86 can protect the conduit layer 84. For example, the armored braid layer 86 can be designed to withstand air temperatures, such as in close proximity to the combustion chamber 14, in the range of from about −55° C. (−67° F.) to about 250° C. (482° F.). However, hotter or colder temperatures are also contemplated.

When used in typical applications, the cable assembly 24 is often exposed to environments which expose the cable assembly 24 to mechanical vibrations. At times, these vibrations can cause moving contact between the armored braid layer 86 and the conduit layer 84 which can abrade the surface of the conduit layer 84. Indeed, this abrasion can eventually lead to a wearing away of the conduit layer 84 to the point of creating a hole in the conduit layer 84, permitting fluid communication between the interior of the cable assembly 24 and the external environment. As this is an undesirable condition, a variety of manufacturing techniques can be applied to the conduit layer 84 to reduce or eliminate the possibility of abrading holes through the conduit layer 84.

The cable assembly 24 further includes one or more coil springs 88. The coil springs are positioned at opposing ends of the cable assembly 24. For example, the first cable end portion 64 includes a first coil spring while the second cable end portion 78 includes a second coil spring. The coil springs 88 axially extend a distance away from the first cable end portion 64 and second cable end portion 78 along an outer surface of the armored braid layer 86. The coil springs 88 can provide bending/strain relief to the cable assembly 24. In particular, the coil springs 88 limit the maximum bending force at each of the first cable end portion 64 and second cable end portion 78. As such, the coil springs 88 function to reduce any excessive bending or the like that may normally occur at the ends of the cable assembly 24. It is to be appreciated that the cable assembly 24 is not limited to the coil springs 88 shown in FIG. 3, and in further examples, could include other structures that provide a similar function. For example, any number of items providing a resistance to bending can be provided in place of the coil springs 88.

As described previously, the cable assembly 24 includes the internal volume 76 (FIG. 4) within the cable assembly 24. The internal volume 76 provides space for the coaxial cable 68 and can be filled with a gas. In one example, the gas includes an inert gas, such as nitrogen, argon, etc. By filling the internal volume 76 with the gas, the coaxial cable 68 is substantially surrounded by the gas. Further, the first cable end portion 64 and second cable end portion 78 can be sealed, as will be further described below, such that the gas is limited from escaping from the internal volume 76. Accordingly, a dry atmosphere is maintained surrounding the coaxial cable 68, while humidity, moisture, etc. are limited from entering the internal volume 76. This dry atmosphere can assist in limiting the degradation of the photocurrent passing through the coaxial cable 68.

The end portions of the cable assembly 24 are generally defined by the presence of a cable fitting 94 of the wire housing 62 located at the first cable end portion 64 and a cable fitting 96 located at the second cable end portion 78. The cable assembly 24 can be sealed at the first cable end portion 64 and second cable end portion 78. For example, the first cable end portion 64 is received within a sealing bore 98 (FIGS. 4 and 5) of the cable fitting 94. The sealing bore 98 extends circumferentially around the first cable end portion 64 and extends axially a distance along the cable assembly 24. The sealing bore 98 and first cable end portion 64 are in contact, such that a first seal 100 is formed therebetween. In further examples, a sealing structure, such as an adhesive, mechanical fastener, weld, etc. may be provided to further attach the sealing bore 98 and first cable end portion 64. In one particular example, the first seal 100 includes a silver-based brazing alloy applied within the sealing bore 98 between the first cable end portion 64 and the cable fitting 94. It is to be understood that to help assure the quality of the silver brazing alloy first seal 100 application, prior to a brazing operation, an amount of silver brazing flux can be applied to either one or both of the mating surfaces of the first cable end portion 64 and the sealing bore 98 of the cable fitting 94. The silver brazing flux can facilitate amalgamation to improve the wetting characteristics of the liquid silver brazing alloy in addition to decreasing the effects of the chemically inert nature of the oxide layer that can naturally form on the stainless steel components of the first cable end portion 64 on the silver braze.

Similarly, the cable assembly 24 can include the cable fitting 96 (FIG. 4) at the second cable end portion 78 of the cable assembly 24. The cable fitting 96 has a sealing bore 106 that is similar in size and shape to the sealing bore 100 of the cable fitting 94. The sealing bore 106 extends circumferentially around the second cable end portion 78 and extends axially a distance along the cable assembly 24. The sealing bore 106 and second cable end portion 78 are in contact, such that a first seal 100 is formed therebetween. In further examples, a sealing structure, such as an adhesive, mechanical fastener, weld, etc. may be provided to further attach the sealing bore 106 and second cable end portion 78. In one particular example, silver brazing alloy is applied within the sealing bore 106 as the first seal 100 between the second cable end portion 78 and the cable fitting 96. It is to be understood that to help assure the quality of the silver brazing alloy first seal 100 application, prior to a brazing operation, an amount of silver brazing flux can be applied to either one or both of the mating surfaces of the second cable end portion 78 and the sealing bore 106 of the cable fitting 96. Again, the silver brazing flux can facilitate amalgamation to improve the wetting characteristics of the liquid silver brazing alloy in addition to decreasing the effects of the chemically inert nature of the oxide layer that can naturally form on the stainless steel components.

As shown in FIG. 4, the structure of cable fitting 94 provides a cap-like end to bound the internal volume 76 within the housing 72 at the first cable end portion 64. Coaxial cable 68 is inserted through cable fitting opening 70 and through the internal volume 76 of the housing 72. In one example, the cable fitting opening 70 has a circular cross section, although other cross sectional shapes are also contemplated. The clearance between the coaxial cable 68 and the cable fitting opening 70 can be relatively small. In one example, the annular space between the coaxial cable 68 and the cable fitting opening 70 is on the order of a few thousandths of an inch.

Figure 5:
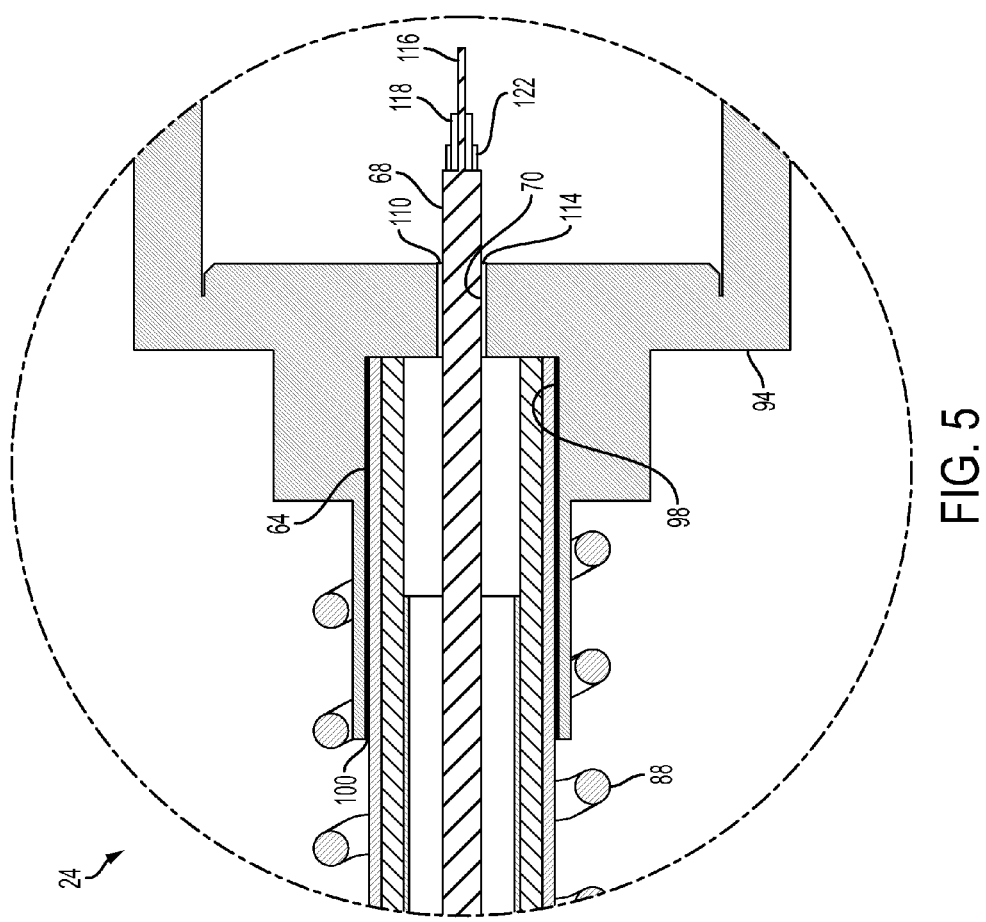
FIG. 5 is a detail view of the first cable end portion enlarged to show a second seal and electrical cable details from the example cable assembly of FIG. 4.

Turning to FIG. 5, an example second seal 110 is provided in the annular spaces between the coaxial cable 68 and the cable fitting opening 70. In one particular example, the second seal 110 includes an epoxy material 114. The epoxy material 114 performs suitably under vibrating conditions as the cable assembly 24 may be subjected to in its normal operating environment. The second seal 110 can include an epoxy material 114 that is a high-temperature epoxy. In one particular example, the high-temperature epoxy is suitable for use up to about 250° C. (482° F.) or greater. The epoxy material 114 can be a commercially available epoxy that limits or eliminates relative movement between the coaxial cable 68 and the cable fitting 94.

Figure 6:
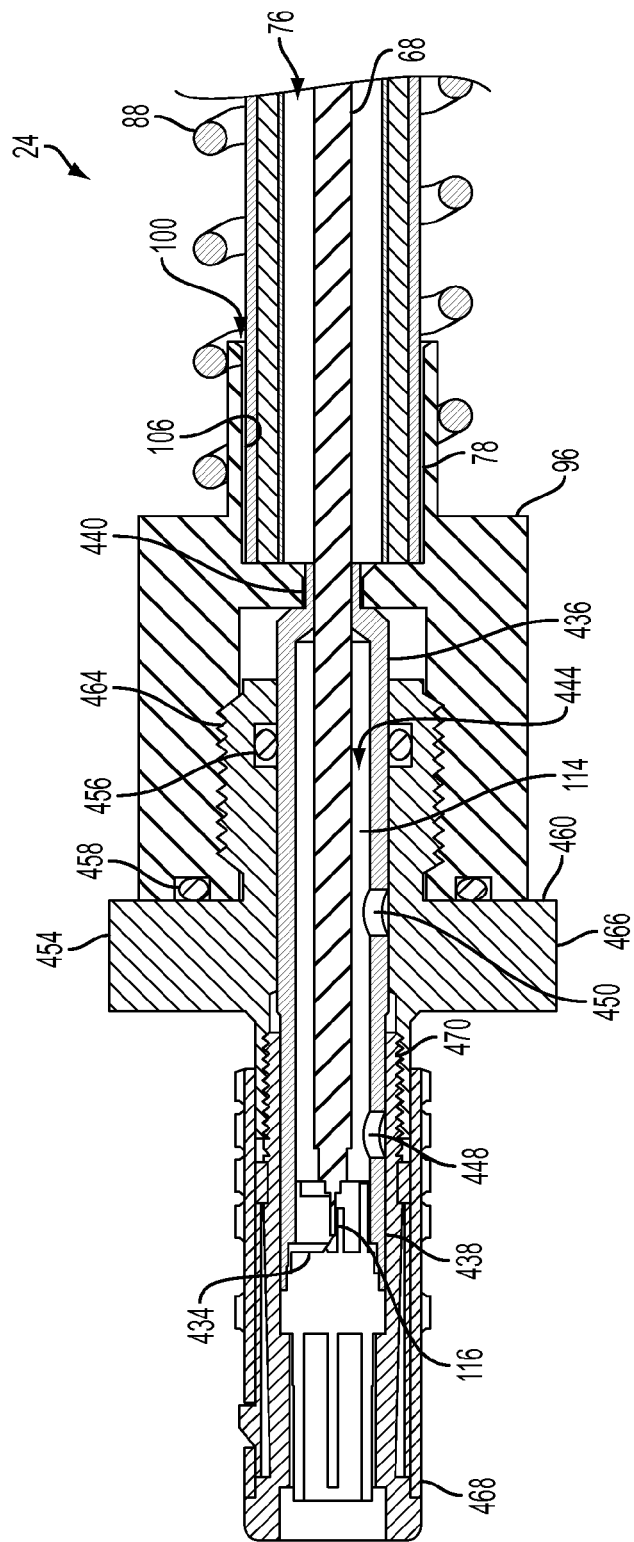
FIG. 6 is a detail view of the second cable end portion enlarged to show a third seal, deformable sealing components and an adapter from the example cable assembly of FIG. 4.

FIG. 6 shows one example of an arrangement to seal the cable assembly 24 at the second cable end portion 78 in accordance with an aspect of the present invention. As mentioned, the second cable end portion 78 is received within the sealing bore 106 of the cable fitting 96. The sealing bore 106 extends circumferentially around the second cable end portion 78 and extends axially a distance along the cable assembly 24. The sealing bore 106 and second cable end portion 78 are in contact. A sealing structure, such as an adhesive, mechanical fastener, weld, etc. may be provided to further attach the sealing bore 106 and second cable end portion 78 and provide a first seal 100. In one particular example, the first seal 100 includes silver brazing alloy applied within the sealing bore 106 between the second cable end portion 78 and the cable fitting 96, similar to the arrangement at the opposite end of the cable assembly 24 described above.

A pin insert 434 is attached to the inner conductor 116 of the coaxial cable 68. The pin insert 434 is further attached to the outer braid, if present, of coaxial cable 68. In one example, the pin insert 434 is soldered to the inner conductor 116 and the outer braid, if present, although alternative forms of attachment are also considered. Any suitable material that readily conducts an electrical signal can be chosen to form the pin insert 434, as the pin insert 434 acts as an electrical connector contact. A sleeve 436 is placed around the coaxial cable 68 and pressed around the pin insert 434 at a first end 438. The sleeve 436 can be constructed of a thin metal to enable the pressing operation around the pin insert 434.

A third seal 444 is provided in the annular space between the coaxial cable 68 and the sleeve 436. In one particular example, the third seal 444 includes an epoxy material 114. The epoxy material 114 performs suitably under high temperature and vibrating conditions as the cable assembly 24 may be subjected to in its normal operating environment. As described above in regards to the second seal 110, the third seal 444 can include the same or a similar high-temperature epoxy, and portions of the coaxial cable 68 can be prepared with an etching process to promote a stronger bond with the epoxy material 114. The epoxy material 114 can be injected into the sleeve 436 prior to competition of overall assembly. For example, the epoxy material 114 can be injected into the sleeve 436 through a first hole 448 defined by the sleeve 436. A second hole 450 enables air and/or other gases to escape the interior space of the sleeve 436 as the epoxy material 114 is being injected. As the sleeve 436 is somewhat sealed at both the first end 438 and the second end 440, the epoxy material 114 is prevented from substantially migrating into the cable assembly 24 or the space exterior to the first end 438. It is to be noted that the epoxy material 114 can form a seal with the pin insert 434, regardless of whether the epoxy material 114 has made a complete seal with the exterior of the coaxial cable 68. In this case, the epoxy material 114 can form a seal with the inner conductor 116 around the pin insert 434. This is advantageous because the relatively high operating temperatures of the cable assembly 24 require a coaxial cable 68 having a PTFE jacket which cannot be easily sealed with an epoxy on its surface.

The sleeve 436 is located within an inner diameter of an adapter 454, and the adapter 454 can be attached to the cable fitting 96. Within the shown example, the adapter can mate threadingly, though other methods of attachment are considered, into an interior volume of the cable fitting 96 as described further below. The interior volume contains the at least a portion of the cable 68 and the sleeve 436. As such, it is possible that the interior volume of the cable fitting 96 may be considered to be part of the interior 76 of the cable assembly 24.

It can be beneficial to create a sealed environment within the interior volume 76 of the cable assembly 24. At the first cable end portion 64, the first seal 100 and the second seal 110 help create the sealed environment (best seen in FIG. 5). At the second cable end portion 78, the third seal 444 helps to create the sealed environment. Additional sealing locations can also be included at the second cable end portion 78. In one example, a deformable sealing component, such as an O-ring 456, forms a seal between the outer diameter surface of the sleeve 436 and the inner diameter of the adapter 454. Within the shown example, the O-ring 456 is located within a recess at the inner diameter of the adapter 454 so that the O-ring 456 rests upon and presses against the outer diameter surface of the sleeve 436. The O-ring 456 may be made of a resilient (e.g., elastically deformable) material such that there is some deformation of the O-ring 456 within the sleeve 436 located within the inner diameter of the adapter 454. It is also contemplated that a sealing aid, such as a grease or other lubricating/viscous material can be applied to the O-ring 456 or associated location.

Further within the shown example, another deformable sealing component, such as an O-ring 458, can form a seal between a flange 460 of the adapter 454 and the cable fitting 96. Within the shown example, the O-ring 458 is located within a recess at an end face of the cable fitting 96 so that the O-ring 458 is pressed against the flange 460 of the adapter 454 once the adapter 454 is sufficiently threaded into the cable fitting 96. The O-ring 458 may be made of a resilient (e.g., elastically deformable) material such that there is some deformation of the O-ring 458 once the adapter 454 is sufficiently threaded into the cable fitting 96. It is also contemplated that a sealing aid, such as a grease or other lubricating/viscous material can be applied to the O-ring 458 or associated location.

It is to be appreciated that these O-rings 456, 458 (e.g., seals) can be placed at other, different locations than those shown in FIG. 6 while still helping to seal the interior volume 76. For example, it is contemplated that O-ring 456 could be placed at a different location (e.g., moved along the axial extent) of the interface between the outer diameter surface of the sleeve 436 and the inner diameter of the adapter 454. It is further contemplated that O-ring 456 could be placed between the outer diameter of the sleeve 436 and the inner diameter of the cable fitting 96. It is further considered that the O-ring 456 could be placed between the second end 440 of the sleeve 436 and the inside face of the cable fitting 96. In this manner the O-ring 456 could create a face seal between the sleeve 436 and the cable fitting 96 in the same fashion that the O-ring 458 does between the adaptor 454 and the cable fitting 96.

As another example, it is contemplated that O-ring 458 could be placed at a different location (e.g., moved radially) of the interface between the flange 460 of the adapter 454 and the end face of the cable fitting 96. Still further, it is contemplated that O-ring 458 could be placed at a different location to between the flange 460 of the adapter 454 and the cable fitting 96. For example, the O-ring 458 could be placed within the interior volume of the cable fitting 96 for engagement by a nose end portion of the adapter 454. It is still further contemplated that the O-ring 458 could be placed between the outside diameter of the adapter 454 and the inside diameter of the cable fitting 96 to create a radial seal in the same fashion as O-ring 456 does between the sleeve 436 and the cable fitting 96.

The adapter 454 can be attached to the cable fitting 96 in any number of ways. In the shown example of FIG. 6, threads 464 on the outer diameter of the adapter 454 can engage corresponding threads on the inner diameter of the cable fitting 96 so that the adapter 454 can threadingly engage the cable fitting 96. Increasing engagement of the threads 464 moves the flange 460 toward the cable fitting 96 in order to compress the O-ring 458, thereby creating a suitable seal for the interior volume 76. In order to ease threading the adapter 454 into the cable fitting 96, wrench flats 466 can be formed into the flange 460 of the adapter 454. This can be advantageous in that it can allow for the seal to be engaged through the use of simple tools. This can increase the convenience of engaging the seal inside a controlled environment. In one example the seal can be engaged with a wrench inside of a dry atmosphere of inert gas to limit the exposure of the coaxial cable 68 to moisture, humidity, or contamination.

An example plug connector 468 can be attached to the sleeve 436 and/or the adapter 454. In the shown example, a commercially available plug connector 468 is threadingly engaged to the adapter 454 with threads 470 located in an annular cavity of the plug connector which correspond to threads on an interior diameter portion of the adapter 454. The connector is configured to electrically connect the coaxial cable 68 to corresponding fittings located on the electrical assembly 28 (see FIG. 1). This electrical connection is used to transmit the electrical signal generated by the photodiode 54 to the electrical assembly 28.

Returning to FIG. 4, the first seal 100, the second seal 110, the third seal 444, and O-rings 456, 458 provide a sealed internal volume 76 such that undesired materials from the external environment including, but not limited to, gas, moisture, condensation, etc. are limited and/or prevented from entering the internal volume 76 of the cable assembly 24. These undesired materials are known to have negative effects on both the coaxial cable 68 and the electrical signal carried by the coaxial cable 68.

The second seal 110 and third seal 444 also provide a barrier to limit and/or prevent materials and/or gases from the internal volume 76 of the cable assembly 24 from leaving the internal volume 76. As previously described the attachment between each cable end portion 64, 78 and its respective cable fitting 94, 96 can be accomplished with a first seal 100 composed of silver brazing alloy applied with silver brazing flux. In one example, the relatively high operating temperatures that the cable assembly 24 can encounter in its normal working environment are high enough to liquefy any brazing flux that may be remaining after brazing a cable end portion 64, 78 to its respective cable fitting 94, 96. Without second seal 110, the silver brazing flux can then migrate from the internal volume 76, through the annular spaces between the coaxial cable 68 and each cable fitting opening 70, 108. The silver brazing flux can then contact a portion of the coaxial cable 68 and negatively affect both the coaxial cable 68 and the electrical signal carried by the coaxial cable 68. These negative effects can cause inaccurate readings of the electrical signal carried by the coaxial cable 68. Inclusion of the second seal 110 limits and/or prevents silver brazing flux or any other material from the internal volume 76 from leaving the sealed internal volume 76 of the cable assembly 24.

The first seal 100, the second seal 110, the third seal 444, and O-rings 456, 458 also help create a sealed environment within the internal volume 76 which can be at least partially filled with a gas. In one example, the gas can be an inert gas, and more specifically, nitrogen or argon though other inert gases are contemplated. The inclusion of an inert gas such as nitrogen or argon can help create a particular environment within the internal volume 76. For example, the sealed internal volume 76 can include an inert and dry gas at a known humidity with no reactive agents within the gas. Such an environment can limit and/or eliminate negative effects to the coaxial cable 68 from humidity, moisture, and reactive gases, and help foster suitable coaxial cable performance over a relatively long time period.

Returning to FIG. 1, an electrical assembly 28 can receive the electrical signal or photocurrent from the coaxial cable 68. It is to be appreciated that any number of connectors or fittings (not shown) can be used to electrically connect the coaxial cable 68 to the electrical assembly 28 including, but not limited to, wires, conductors, or other similar electrical structures. The electrical assembly 28 is positioned outside of the turbine 16 and spaced a distance apart from the combustion chamber 14. Accordingly, the electrical assembly 28 can be positioned in a location that has a lower temperature than within the turbine 16, such that electronics can be used in the electrical assembly 28 without being subjected to relatively high temperatures.

The electrical assembly 28 can include a circuit board (not shown) to receive the photocurrent from the coaxial cable 68 or intermediate electrical connections. The circuit board can include electrical hardware, such as an amplifier circuit including any number of configurations. The photocurrent is received by the amplifier circuit, and then is processed and amplified by signal circuitry to produce an electrical signal. In one example, the photocurrent can be amplified and converted into a current in a range of about 4 milliamperes (mA) to about 20 mA.

This electrical signal in the form of a current is indicative of the specific characteristics of the flame 12. These characteristics include, but are not limited to, the presence or absence of the flame 12 within the combustion chamber 14. In the event of a flame-out condition wherein the flame 12 has been extinguished, the absence of electromagnetic radiation energy at the photodiode 54 is detected. The absence of electromagnetic radiation energy will cause the photodiode 54 to provide an electrical signal in the form of the photocurrent that is low or zero. This photocurrent is delivered through the cable assembly 24 and to the amplifier circuit on the circuit board. This photocurrent is amplified and converted into a current that is indicative of the flame's characteristics (e.g., flame-out condition). This electrical signal can then be sent to a fuel control apparatus, or the like, that can reduce and/or stop the supply of fuel through the fuel nozzle 30 and into the combustion chamber 14. As such, the electrical signal from the photodiode 54 can be used to control the supply of fuel into the fuel nozzle 30.

Referring again to FIG. 1, the operation of the flame sensor apparatus 10 will now be described in more detail. Fuel is provided to the combustion chamber 14 through the fuel nozzle 30, producing the flame 12. A sight tube 18 projects a distance outwardly from the combustion chamber 14 and defines an optical path from the sight tube 18 towards the flame 12. The sensor assembly 20 is attached to the sight tube, such that the sensor assembly 20 is spaced a distance away from the combustion chamber 14.

Electromagnetic radiation energy, indicative of the specific characteristics of the flame 12, is conveyed from the flame 12 in the combustion chamber 14, through the sight tube 18 and into the sensor assembly 20. The lens 52 (shown in FIG. 2) focuses the electromagnetic radiation energy in the sensor assembly 20 onto the photodiode 54. In response, the photodiode 54 produces an electrical signal based on the intensity of the electromagnetic radiation energy. This electrical signal can be in the form of a photocurrent that is indicative of the specific characteristics of the flame 12, including, but not limited to, the presence or absence of the flame.

The cable assembly 24 conveys the photocurrent from the sensor assembly 20 to the electrical assembly 28. In particular, the photocurrent passes through the coaxial cable 68 which at least a portion of its length is sealed within the cable assembly 24. This photocurrent can travel along the length of the cable assembly 24 from the first cable end portion 64 to the second cable end portion 78. The relatively small photocurrent is protected from triboelectric noise, electromagnetic interference, and signal degradation in a number of ways. For example, since the coaxial cable 68 is a low noise cable, signal degradation is reduced. Further, the cable assembly 24 can be sealed within an environment of a dry inert gas, further limiting the effects of moisture, condensation, gas, etc. on the coaxial cable 68. In addition, the cable assembly 24 includes the sock layer 80, conduit layer 84, and armored braid layer 86. One or more of these layers can further assist in reducing the effects of triboelectric noise and electromagnetic interference. As such, integrity of the photocurrent can be maintained as the photocurrent is conveyed along the cable assembly 24.

The photocurrent at the second cable end portion 78 passes to the electrical assembly 28, to the circuit board. The amplifier circuit that is attached to the circuit board receives and amplifies the photocurrent. In response, an electrical signal is produced, such as a current in the range of about 4 mA to about 20 mA. This electrical signal in the form of a current indicates specific characteristics of the flame 12, such as the presence or absence of the flame. As such, in the event of a flame-out condition when the flame 12 has been extinguished, the current output is low or zero. This current output can trigger the fuel control apparatus to reduce and/or stop the supply of fuel into the combustion chamber 14.

The electrical assembly 28 is positioned a distance away from the combustion chamber 14 outside of the turbine 16. As such, the electrical assembly 28 is not located within the relatively high temperature/vibration environment of the turbine 16. Accordingly, the electrical assembly 28 is remote from the photodiode 54 in the sensor assembly 20. The electrical assembly 28 is subjected to relatively lower temperatures/vibrations than the photodiode 54 in the sensor assembly 20.

Figure 7:
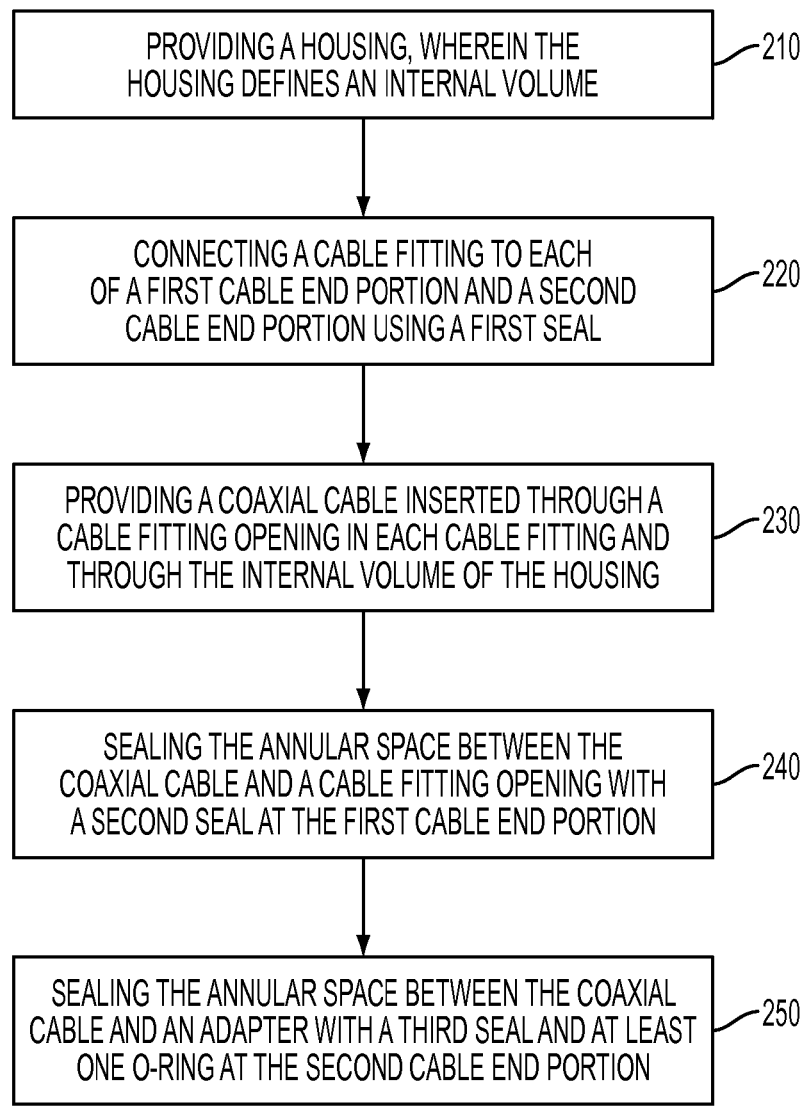
FIG. 7 is a top level flow diagram of an example method of sealing an electrical cable and a flexible conduit.

An example method of sealing an electrical cable and a flexible conduit is generally presented within the flowchart of FIG. 7. The method can be performed in connection with the example flame sensor apparatus 10 shown in FIG. 1 and the example cable assembly 24 shown in FIG. 4. The method includes the step 210 (FIG. 7) of providing a housing 72. The housing 72 can include several layers, for example, a sock layer 80, a conduit layer 84, and an armored braid layer 86 defining an internal volume 76. The housing 72 can include a first cable end portion 64 and a second cable end portion 78.

The method further includes the step 220 (FIG. 7) of connecting a cable fitting 94, 96 to each of the first cable end portion 64 and the second cable end portion 78 using a first seal 100. In one example, the sealing bore 98 and first cable end portion 64 are in contact, such that a first seal 100 is formed therebetween. In further examples, a sealing structure, such as an adhesive, mechanical fastener, weld, etc. may be provided to further attach the sealing bore 98 and first cable end portion 64. In one particular example, silver brazing alloy is applied within the sealing bore 98 as the first seal 100 between the first cable end portion 64 and the cable fitting 94. Similarly, the sealing bore 106 and second cable end portion 78 are in contact, such that a first seal 100 is formed therebetween. In further examples, a sealing structure, such as an adhesive, mechanical fastener, weld, etc. may be provided to further attach the sealing bore 106 and second cable end portion 78. In one particular example, silver brazing alloy is applied within the sealing bore 106 as the first seal 100 between the second cable end portion 78 and the cable fitting 96. The step of connecting a cable fitting 94, 96 to each of the first cable end portion 64 and the second cable end portion 78 using a first seal 100 can be completed prior to inserting a coaxial cable 68 through the cable assembly 24.

The method further includes the step 230 (FIG. 7) of providing a coaxial cable 68. The coaxial cable 68 is inserted through the cable fitting opening 70, 108 in each cable fitting 94, 96 and through the internal volume 76 of the housing 72, which is one example of a flexible conduit. As seen in FIG. 3, the coaxial cable 68 can extend through the cable assembly 24 for substantially all of the length of the cable assembly 24, permitting electrical connections with adjacent devices such as the sensor assembly 20 and the electrical assembly 28.

The method still further includes the step 240 (FIG. 7) of sealing the annular space between the coaxial cable 68 and each cable fitting opening 70 located at the first cable end portion 64 with a second seal 110. The second seal 110 can help create a hermetic seal preventing moisture and contaminants from passing through the cable fitting opening. The second seal 110 can also limit and/or eliminate passage of materials from within the internal volume 76 to the external environment. In one example the second seal 110 can include an epoxy material. In another example, the second seal 110 can include a high-temperature epoxy for use up to about 250° C. (482° F.) or greater.

The second seal 110 can be applied with any number of methods. In one example, the step of sealing the annular spaces between the coaxial cable 68 and the cable fitting opening 70 with the second seal 110 can be accomplished with a syringe-like instrument. Some examples of commercially available high-temperature epoxy initially flow like water after leaving the syringe-like instrument. Capillary action draws the high-temperature epoxy into the annular space between the coaxial cable 68 and the cable fitting opening 70 where the high-temperature epoxy hardens, forming the second seal 110. In one example, the clearance space between the coaxial cable 68 and the cable fitting opening 70 is a few thousandths of an inch.

The method also includes the step 250 (FIG. 7) of sealing the annular spaces between the coaxial cable 68 and an adapter 454 with a third seal 444 and at least one O-ring 456, 458 at the second cable end portion 78. One example method of sealing the annular spaces at the second cable end portion 78 can include several steps. As described above, the sealing bore 106 and second cable end portion 78 are placed in contact, such that a first seal 100 is formed therebetween. In further examples, a sealing structure, such as an adhesive, mechanical fastener, weld, etc. may be provided to further attach the sealing bore 106 and second cable end portion 78. In one particular example, silver brazing alloy is applied within the sealing bore 106 as the first seal 100 between the second cable end portion 78 and the cable fitting 96.

A pin insert 434 is attached to the inner conductor 116 and the outer braid, if present, of the coaxial cable 68. In one example, the pin insert 434 is soldered to the inner conductor 116 and outer braid, if present, although alternative forms of attachment are also considered. A sleeve 436 is placed around the coaxial cable 68 and pressed around the pin insert 434 at a first end 438. Additionally, the second end 440 of the sleeve 436 can be substantially sealed with the coaxial cable 68. In one example, the second end 440 of the sleeve 436 can be pressed against the coaxial cable 68. Sealing the second cable end portion 78 can then include the step of creating third seal 444 in the annular space between the coaxial cable 68 and the sleeve 436. In one example, an epoxy material 114 is injected through a first hole 448 defined by the sleeve 436. The epoxy material 114 fills at least a portion of the annular space to create a seal. It is to be appreciated that the seal can be between the coaxial cable 68 and the sleeve 436 and additionally or alternatively between the pin insert 434 and the sleeve 436. In one example, epoxy material 114 exiting the annular space via the second hole 450 defined by the sleeve 436 can indicate that a suitable amount of epoxy material 114 has been injected into the annular space.

With O-ring 456 and O-ring 458 in their designated locations, adaptor 454 is slidingly placed over the sleeve 436 and engaged with the cable fitting 96. In one example, the adaptor 454 is threaded into the cable fitting 96. The adaptor 454 is threaded to a pre-determined depth so that the O-ring 458 is not compressed between the adaptor 454 and the cable fitting 96, thereby not yet forming a seal. In other words, the atmosphere exterior to the internal volume 76 and the atmosphere within the internal volume 76 can comingle and pass freely to either side of the O-ring 458. A commercially available plug connector 468 is then attached to the adapter 454. In one example, the plug connector 468 is placed in threaded engagement with the adapter 454. If so desired, a sealant or adhesive can be used in conjunction with the threads 470 to create a seal or a bond between the threads of the plug connector 468 and the adapter 454.

In a further example of the method, additional steps prior to the step of sealing the annular spaces can be included. In one example, the method can also include the steps of evacuating the ambient atmosphere from the internal volume 76 and filling the internal volume 76 with an inert gas. The partially complete cable assembly 24 can then be placed in a controlled atmosphere. In one example, this controlled atmosphere can be an oven. At least a portion of the ambient air can then be removed from the oven, thereby evacuating the ambient atmosphere from the internal volume 76. Heat can be added to the oven interior to control the humidity.

Inert gas can then be added to the oven interior, thereby filling the internal volume 76 with the inert gas. Examples of inert gas can include nitrogen and argon. After the inert gas fills the internal volume 76, the oven can be opened. The adapter 454 can then be further engaged with the cable fitting 96 to compress the O-ring 458 and seal the cable assembly 24. In one example, further engagement of the adaptor 454 with the cable fitting 96 includes threading the adapter 454 into the cable fitting 96. The wrench flats 466 can be engaged by a wrench or other rotatable tool to thread the adapter 454 into the cable fitting 96. Thus, the internal volume 76 is sealed and at least partially filled with an inert, dry gas at a known humidity, thereby limiting and/or eliminating entry of undesired contaminants into the internal volume 76, and sealing material such as the inert gas and brazing flux within internal volume 76. In one example, the evacuation of the ambient atmosphere from the internal volume 76 and filling the internal volume 76 with inert gas are the only two steps that require a controlled atmosphere.

In the described examples, the methods and apparatus provide a hermetically sealed and vibration resistant cable assembly 24 and methods of sealing the cable assembly 24. The described methods and apparatus further provide a cable assembly 24 or conduit that provides protection to a coaxial cable 68 from pinching, cutting, bending, and other potentially damaging actions that the cable assembly 24 may experience in normal operating environments. The cable assembly 24 can help keep the coaxial cable 68 safe and/or functional with an armored conduit portion. Electrical signals moving along the coaxial cable 68 can experience limited degradation through the use of a low noise cable for the coaxial cable 68 and providing an inert, dry atmosphere with few or no reactive elements contacting the coaxial cable 68, including moisture, solid contaminants, and/or brazing flux. Additionally, the inclusion of seals within the cable assembly 24 can provide for a cable assembly 24 that is easily replaced in the field. In some known examples, the seals that help provide an inert, dry atmosphere within the internal volume 76 are located in other components, such as the sensor assembly 20 and the electrical assembly. The described example cable assembly 24 is more easily interchangeable because of its incorporated seals, providing ease of replacement of the cable assembly 24 with less concern of negatively affecting the inert, dry atmosphere surrounding the coaxial cable 68.

Additionally, the described methods and apparatus provide a relatively simple way of manufacturing the cable assembly 24 with a minimal use of a controlled atmosphere, such as an oven. In this example, the final applied seal for the cable assembly 24 is a mechanical seal applied outside of an oven. The described methods and apparatus will improve the seal reliability, thereby improving the reliability and extending the lifetime of the finished cable assembly 24. Furthermore, the described cable assembly 24 has reduced manufacturing cost and effort associated with its manufacture.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed is:

1. A cable assembly including:
a housing, wherein the housing defines an internal volume and the housing includes a first cable end portion and a second cable end portion;
at least two cable fittings, wherein the first cable end portion and the second cable end portion are connected to a respective cable fitting through a first seal, each of the cable fittings defining a cable fitting opening;
an electrical cable, wherein the electrical cable is inserted through the cable fitting opening in each cable fitting and through the internal volume of the housing;
a second seal located in the annular space between the electrical cable and the cable fitting opening at the first cable end portion, the second seal being configured to prevent moisture and contaminants from passing through the cable fitting opening; and
a third seal and at least deformable sealing component located at the second cable end portion, the third seal and the at least deformable sealing component being configured to prevent moisture, gas, and contaminants from passing through the cable fitting opening.

2. The cable assembly according to claim 1, wherein the second seal and/or third seal include an epoxy material.

3. The cable assembly according to claim 2, wherein the epoxy material is a high-temperature epoxy for use up to about 250° C. or greater.

4. The cable assembly according to claim 1, wherein the internal volume is sealed and filled with an inert gas.

5. The cable assembly according to claim 1, wherein the first seal includes silver brazing alloy and silver brazing flux.

6. A flame sensor apparatus including:
- a sensor assembly for sensing characteristics of a flame within a combustion chamber;
- an electrical assembly that is remote from the sensor assembly; and
- a cable assembly extending between the sensor assembly and the electrical assembly, the cable assembly including:
- a housing, wherein the housing defines an internal volume and the housing includes a first cable end portion and a second cable end portion;
- at least two cable fittings, wherein the first cable end portion and the second cable end portion are connected to a cable fitting through a first seal, each of the cable fittings defining a cable fitting opening;
- an electrical cable, wherein the electrical cable is inserted through the cable fitting opening in each cable fitting and through the internal volume of the housing;
- a second seal located in annular space between the cable and the cable fitting opening located at the first cable end portion, the second seal being configured to prevent moisture, gas, and contaminants from passing through the cable fitting opening;
- a third seal and at least one deformable sealing component located at the second cable end portion, the third seal and the at least one deformable sealing component being configured to prevent moisture, gas, and contaminants from passing through the cable fitting opening.

7. The flame sensor apparatus according to claim 6, wherein the second seal and/or the third seal include an epoxy material.

8. The flame sensor apparatus according to claim 7, wherein the epoxy material is a high-temperature epoxy for use up to about 250° C. or greater.

9. The flame sensor apparatus according to claim 6, wherein the internal volume is sealed and filled with an inert gas.

10. The flame sensor apparatus according to claim 6, wherein the first seal includes silver brazing alloy and silver brazing flux.

11. The flame sensor apparatus according to claim 6, wherein the characteristics of the flame include the presence and absence of the flame within the combustion chamber.

12. The flame sensor apparatus of claim 6, wherein the cable assembly is attached at one end to the sensor assembly and attached at an opposing second end to the electrical assembly.

13. A method of sealing an electrical cable and a flexible conduit including:
- providing a housing, wherein the housing defines an internal volume and the housing includes a first cable end portion and a second cable end portion;
- connecting a cable fitting to each of the first cable end portion and the second cable end portion using a first seal, each of the cable fittings defining a cable fitting opening;
- providing an electrical cable, wherein the electrical cable is inserted through the cable fitting opening in each cable fitting and through the internal volume of the housing;
- sealing the annular space between the electrical cable and a cable fitting opening with a second seal at the first cable end portion, the second seal preventing moisture, gas, and contaminants from passing through the cable fitting opening; and
- sealing the annular space between the electrical cable and a cable fitting with a third seal and at least one deformable sealing component at the second cable end portion.

14. The method according to claim 13, further including the steps of:
- evacuating an ambient atmosphere from the internal volume; and
- filling the internal volume with an inert gas,
- each of the steps occurring prior to the step of sealing the annular space, and wherein the steps of evacuating the ambient atmosphere and filling the internal volume are the only steps requiring a controlled atmosphere.

15. The method according to claim 14, wherein the controlled atmosphere includes an atmosphere within an oven.

16. The method according to claim 13, wherein the second seal and the third seal includes an epoxy material.

17. The method according to claim 15, wherein the epoxy material is a high-temperature epoxy for use up to about 250° C. or greater.

18. The method according to claim 15, wherein the inert gas is selected from the group consisting of nitrogen and argon.

* * * * *